(12) United States Patent
Okada

(10) Patent No.: US 8,097,939 B2
(45) Date of Patent: Jan. 17, 2012

(54) SEMICONDUCTOR MEMORY CARD

(75) Inventor: Takashi Okada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 12/334,642

(22) Filed: Dec. 15, 2008

(65) Prior Publication Data

US 2009/0168322 A1 Jul. 2, 2009

(30) Foreign Application Priority Data

Dec. 26, 2007 (JP) .................. 2007-334782

(51) Int. Cl.
*H01L 23/02* (2006.01)
(52) U.S. Cl. .................. 257/679; 361/679.32
(58) Field of Classification Search .......... 257/679; 361/679.32
See application file for complete search history.

(56) References Cited

U.S. PATENT DOCUMENTS

| | | | | |
|---|---|---|---|---|
| 6,590,778 B1 * | 7/2003 | Hojo et al. | ..... | 361/737 |
| 2003/0183914 A1 * | 10/2003 | Wallace | ..... | 257/678 |
| 2006/0014434 A1 | 1/2006 | Yamamoto et al. | | |
| 2007/0228509 A1 | 10/2007 | Okada et al. | | |
| 2007/0263365 A1 * | 11/2007 | Yamada et al. | ..... | 361/737 |

FOREIGN PATENT DOCUMENTS

| | | |
|---|---|---|
| JP | 2007-128959 | 5/2007 |
| WO | WO 2004/081858 | 9/2004 |

OTHER PUBLICATIONS

U.S. Appl. No. 12/610,504, filed Nov. 2, 2009, Okada.
Office Action issued Jun. 20, 2011 in Korean Application No. 10-2008-133698 (w/partial English translation).

* cited by examiner

*Primary Examiner* — Lex Malsawma
(74) *Attorney, Agent, or Firm* — Oblon, Spivak, McClelland, Maier & Neustadt, L.L.P.

(57) ABSTRACT

The semiconductor memory card related to the present invention is arranged with a plurality of semiconductor memory packages, a controller chip which controls the plurality of semiconductor memory packages, and a substrate mounted with the plurality of semiconductor chips on one surface and the controller chip mounted on the other surface corresponding to a position in which the external force of the first surface is concentrated.

15 Claims, 15 Drawing Sheets

US 8,097,939 B2

SEMICONDUCTOR MEMORY CARD

CROSS REFERENCE TO RELATED APPLICATION

This application is based on and claims the benefit of priority from the prior Japanese Parent Application No. 2007-334782, filed on Dec. 26, 2007, the entire contents of which are incorporated herein by reference.

BACKGROUND OF THE INVENTION

1. File of the Invention

This invention is related to a semiconductor memory card which is connected with and uses an external device.

2. Description of the Related Art

The semiconductor memory card described in Japan Laid Open Patent 2007-128959 is arranged with a substrate with a first conductor pattern formed on the top surface and a second conductor pattern formed on the bottom surface and a memory package solder mounted on the circuit substrate and at least one part of the first conductor pattern and at least one part of the second conductor pattern have a symmetrical shape seen from the planar surface of the circuit substrate. In this semiconductor memory card, warping of the circuit substrate can be controlled at the time or a thermal reflow process of the semiconductor memory package.

BRIEF SUMMARY OF THE INVENTION

The semiconductor memory card related to the present invention is arranged with a plurality of semiconductor memory packages, a controller chip which controls the plurality of semiconductor memory packages, and a substrate mounted with the plurality of semiconductor chips on one surface (first surface) and the controller chip mounted on the other surface (second surface).

DETAILED DESCRIPTION OF THE INVENTION

The embodiments of the present invention will be explained below while referring to the diagrams. The semiconductor memory card related to the embodiments is explained here using an SD memory card™ as an example. Furthermore, in the embodiments of this invention, the same structural elements have the same symbols and an explanation of these elements is sometimes omitted to avoid repetition.

First Embodiment

Figure 1:
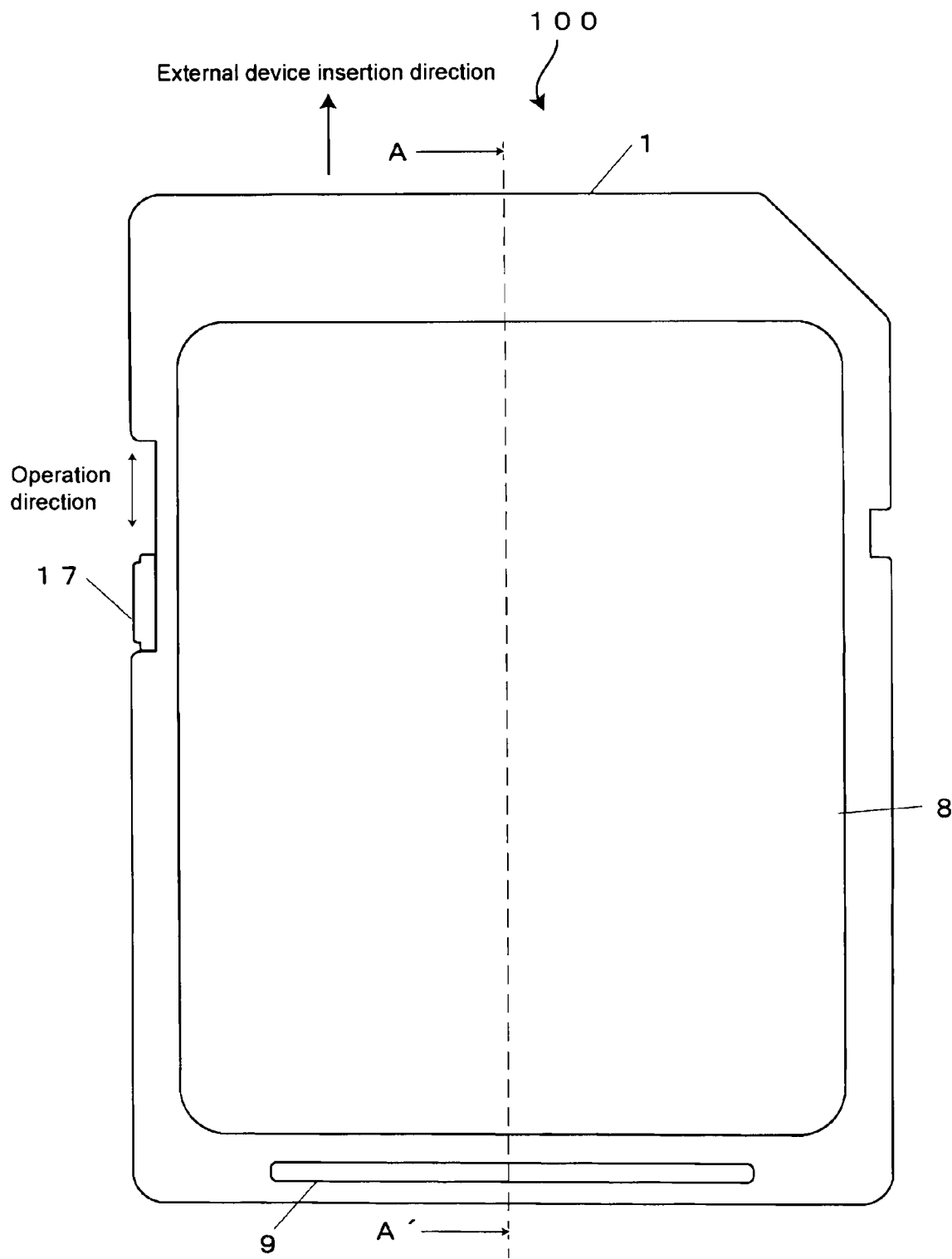
FIG. 1 is a planar view diagram which shows the external appearance of an SD memory card™ related to the first embodiment.

FIG. 1 is a planar view diagram which shows the exterior appearance of an SD memory card™. In FIG. 1, the SD memory card™ 100 includes a top case (first case element) 1, a label sticker groove part 8, a grip 9 and a write protect switch 17. The vertical direction in the diagram indicates the insertion direction in which the SD memory card™ which is connected to an external device is inserted. The label sticker groove part 8 is a part to which a label printed with the specifications etc of the SD memory card™ 100 is attached.

The grip 9 is a part which part which is held when the SD memory card™ 100 is connected to or removed from an external device. The write protect switch 17 is a switch which operates when writing data to the memory package mounted with the SD memory card™ 100 is forbidden. The write protect switch 17 can be switched between a write protect mode setting and release of a write protect mode by sliding the switch in the direction of the arrow shown in the diagram.

Figure 2:
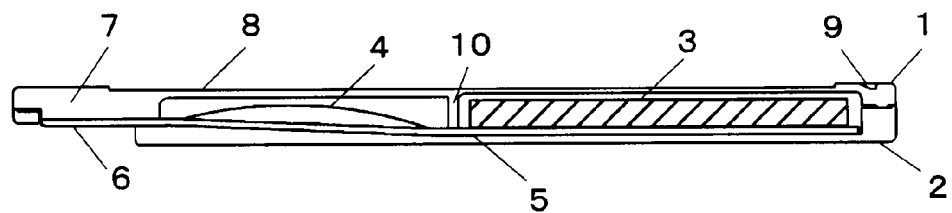
FIG. 2 is a cross sectional view of the line A-A' of the SD memory card™ shown in FIG. 1 related to the first embodiment.
Figure 3:
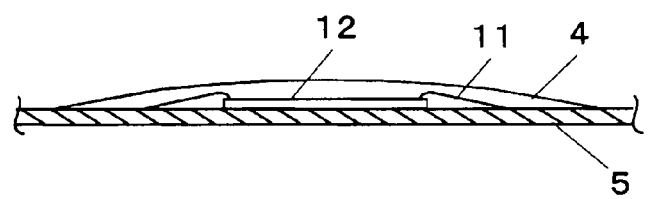
FIG. 3 is a diagram which shows a cross section of a potting resin part shown in FIG. 2 relate to the first embodiment.

FIG. 2 is a cross sectional view diagram of the line A-A' of the SD memory card™ shown in FIG. 1. The same symbols are attached to the same structural elements shown in FIG. 1. In FIG. 2, 2 is a bottom case (second case element), 3 is a memory package (semiconductor memory package) which uses a NAND type flash memory etc, 4 is a resin potting, 5 is a substrate, 6 is a terminal part which for connecting with a terminal of an external device, 7 is a terminal part case rib and 10 is an top case rib. FIG. 3 is a diagram which shows a cross section of the resin potting 4 parts shown in FIG. 2. In FIG. 3, 11 is a bonding wire, and 12 is a controller chip which controls the memory package 3. Furthermore, a TSOP (Thin Small Outline Package), LGA (Land Grid Package) or BGA (Ball Grid Array) etc may used as the memory package 3.

Figure 4:
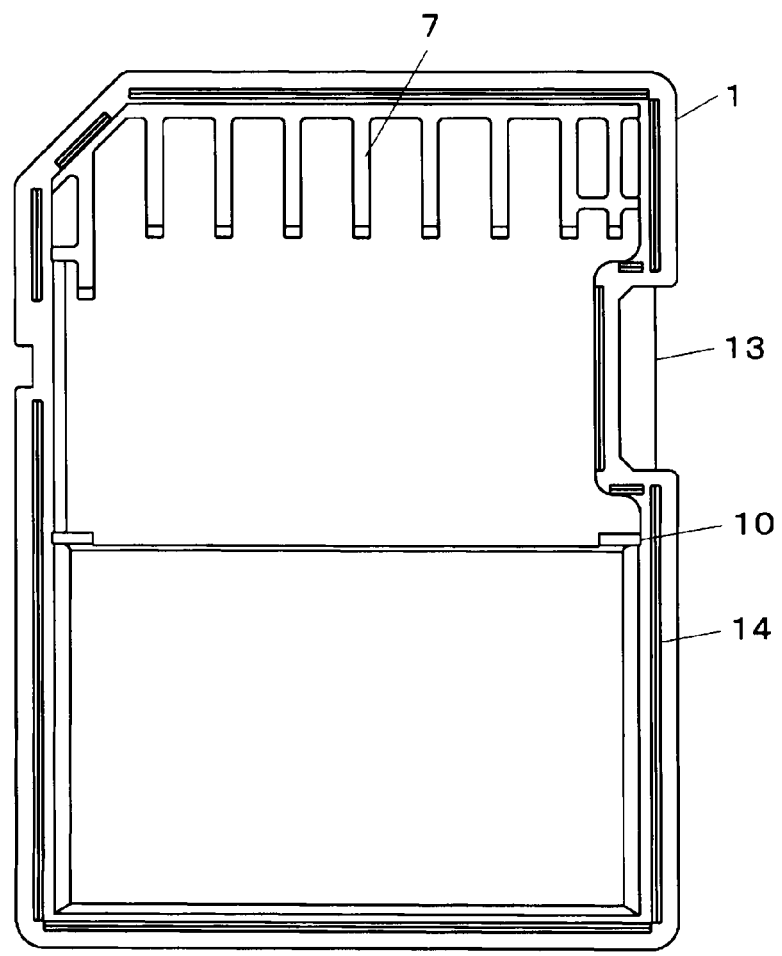
FIG. 4 is a planar view diagram which shows the internal structure of a top case shown in FIG. 1 and FIG. 2 related to the first embodiment.

FIG. 4 is a planar view diagram which shows the structure within the top case 1 shown in FIG. 1 and FIG. 2. In FIG. 4, the same symbols are used for the same structural elements as in FIG. 1 and FIG. 2. In FIG. 4, 13 is a recess part which houses the write protect switch 17, and 14 is a protrusion part for welding (energy director) for welding the top case 1 to the bottom case 2. The protrusion part for welding 14 is arranged around the entire edge part within the top case 1.

Figure 5:
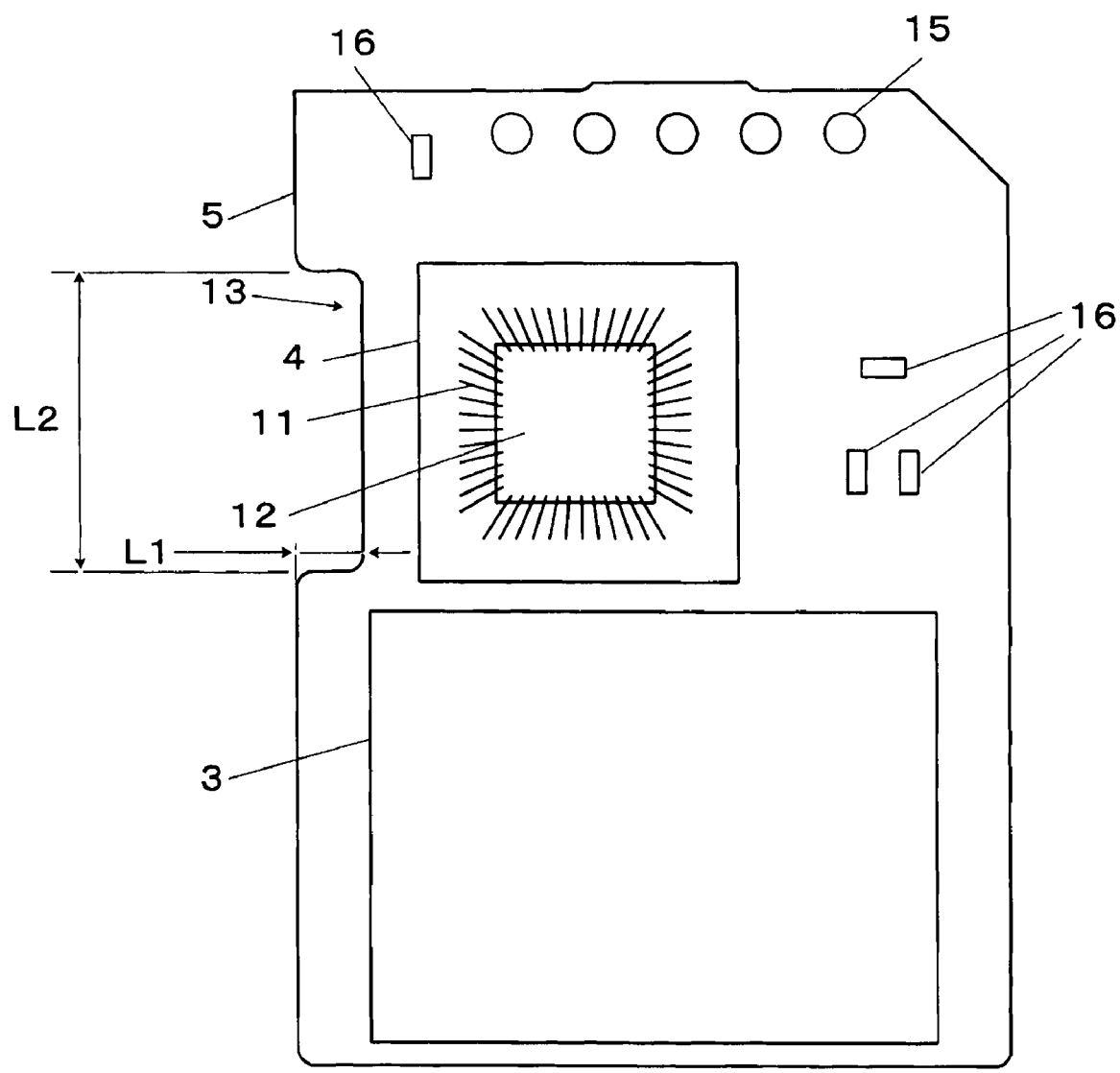
FIG. 5 is a planar view diagram which shows the structure of an element mounting surface of the substrate 5 shown in FIG. 2 related to the first embodiment.

FIG. 5 is a planar view diagram which shows the structure of an element mounting surface of the substrate 5 shown in FIG. 2. In FIG. 5, the same symbols are used for the same structural elements as in FIG. 2. In FIG. 5, 15 is a test pad which is used when testing the operation of the memory package 3 and the controller chip 12, and 16 is a chip condenser. In addition, in FIG. 5, a recess part 13 is formed corresponding to the recess part 13 which is formed in a mounting position of the write protect switch 17 in the above stated bottom case 2 on the substrate 5.

Figure 6:
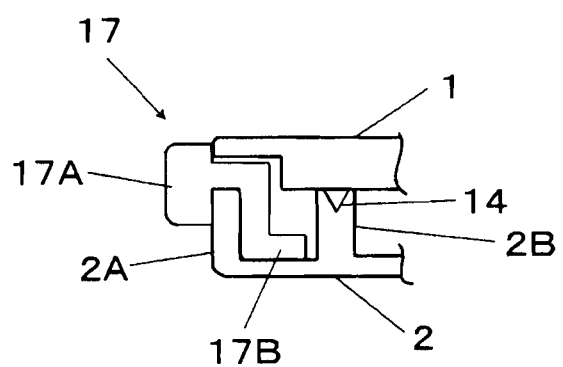
FIG. 6 is a cross sectional view diagram which shows the structure of a write protect switch part shown in FIG. 1 related to the first embodiment.
Figure 7:
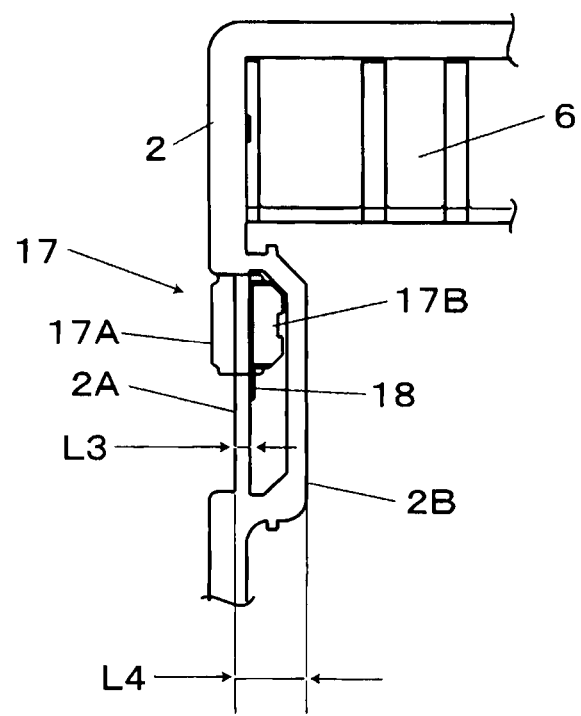
FIG. 7 is a planar view diagram which shows the structure of a write protect switch part shown in FIG. 1 related to the first embodiment.

FIG. 6 is a cross sectional view diagram which shows the structure of the write protect switch 17 part shown in FIG. 1. FIG. 7 is planar view diagram which shows the structure of the write protect switch 17 part shown in FIG. 1. In FIG. 6 and FIG. 7, the same symbols are used for the same structural elements as in FIG. 1. In FIG. 6, the write protect switch 17 is comprised from an operation part 17A in an operation direction shown in FIG. 1, and a switch main body part 17B which slides along the inner surface of the bottom case 2 according to an operation of the operation part 17A. In FIG. 7, 18 is a protrusion part for switch operation and is arranged on a side surface within the bottom case 2. The protrusion part for switch operation 18 is arranged so that resistance is provided to the switch main body part 17B when sliding the operation part 17A of the write protect switch 17. As a result, the write protect switch 17 does not perform a slide operation unless a certain amount of force is applied to the operation part 17A. That is, the protrusion part for switch operation 18 is arranged so that setting and release of a write protect mode can be operated reliably.

The external dimensions of the SD memory card™ 100 constructed as shown in FIG. 1 to FIG. 7, are regulated. The external dimensions of the external appearance view of the SD memory card™ 100 shown in FIG. 1 are, for example, height 32 mm and length 24 mm. In addition, in the cross sectional view of the SD memory card™ shown in FIG. 2, the thickness of the entire case constructed from the top case 1 and the bottom case 2 is 2.1 mm. Therefore, in the SD memory card™ 100, it is necessary to house the substrate 5, the memory package 3, the controller chip 12, the chip condenser 16 and the write protect switch 17 etc within the external dimensions shown. In addition, elements for processing large amounts of data such as voice data and image data, increase in the external device connected to the SD memory card™ 100. As a result, it is preferred that memory capacity is increased in the SD memory card™ 100 which has many opportunities for being used as a data storage device. In the SD memory card™ 100, for example, increasing the memory capacity of the memory package 3 itself and mounting a plurality of the memory packages 3 is considered as a method for increasing memory capacity.

As is shown in FIG. 2, in the SD memory card™ 100 in which the memory package 3 is mounted on only one surface of the substrate 5, in the case of increasing memory capacity, it is necessary to increase the memory capacity of the memory package 3 itself. However, because a method for greatly increasing the memory capacity of the memory package 3 is restricted by the specifications of the memory package 3 itself, (design rules or dimensions of the chip etc) significantly increasing memory capacity is difficult.

In addition, because the external dimensions of the SD memory card™ 100 are regulated as stated above, the external dimensions of the substrate 5 which is housed in the case are also restricted and each external dimension of the memory package 3 and controller chip 12 which can be mounted on the substrate 5 are also restricted. Furthermore, because the recess part 13 is formed on the substrate 5 in order to secure a mounting region for the write protect switch 17, the chip mounting region is further reduced. Therefore, as in the SD memory card™ shown in FIG. 2, in the construction where the memory package 3 and the controller chip 12 are mounted on only one surface of the substrate 5, it is becoming increasingly difficult to realize a chip arrangement in which memory capacity within a limited mounting region on the substrate 5, is further increased.

Thus, in FIG. 8 to FIG. 14 shown below, an example structure is shown in which a plurality of memory packages can be mounted on the substrate 5 in the SD memory card™ which has regulated dimensions.

Figure 8:
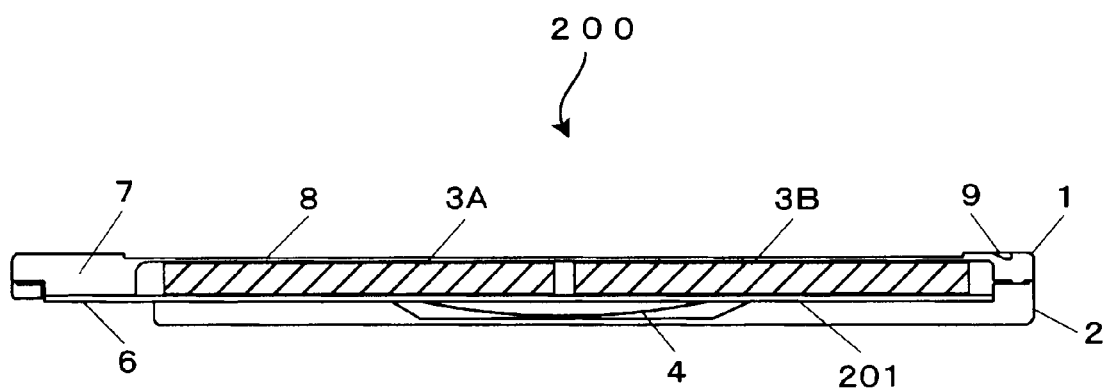
FIG. 8 is a cross sectional view diagram which shows the structure of the SD memory card™ related to the first embodiment.
Figure 9:
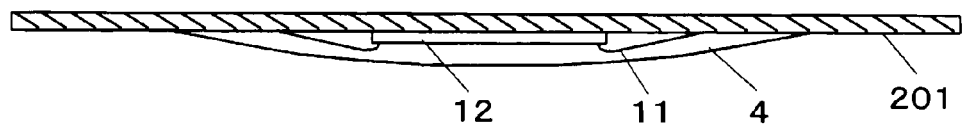
FIG. 9 is a cross sectional view diagram which shows the structure of resin potting part shown in FIG. 8 related to the first embodiment.

FIG. 8 is a cross sectional view diagram which shows a construction of a SD memory card™ 200 related to the first embodiment. FIG. 9 is a cross section view diagram which shows a construction of a resin potting 4 part shown in FIG. 8. In FIG. 8 and FIG. 9, the same structural elements as in FIG. 2 and FIG. 3 have the same symbols.

In FIG. 8 and FIG. 9, two memory packages 3A and 3B are mounted on the top surface (first surface) of a substrate 201 and the controller chip 12 sealed by the resin potting 4 is mounted on the bottom surface (second surface) of the substrate 201. In this case, by moving the mounting position of the controller chip 12 to the bottom surface of the substrate 201, it is possible to mount the two memory packages 3A and 3B on the top surface of the substrate 201. Therefore, in the SD memory card™ 200, by mounting two memory packages 3A and 3B which have the same memory capacity as the memory package 3 mounted in the SD memory card™ 100 stated above, it is possible to easily increase memory capacity by at least twice.

Figure 10:
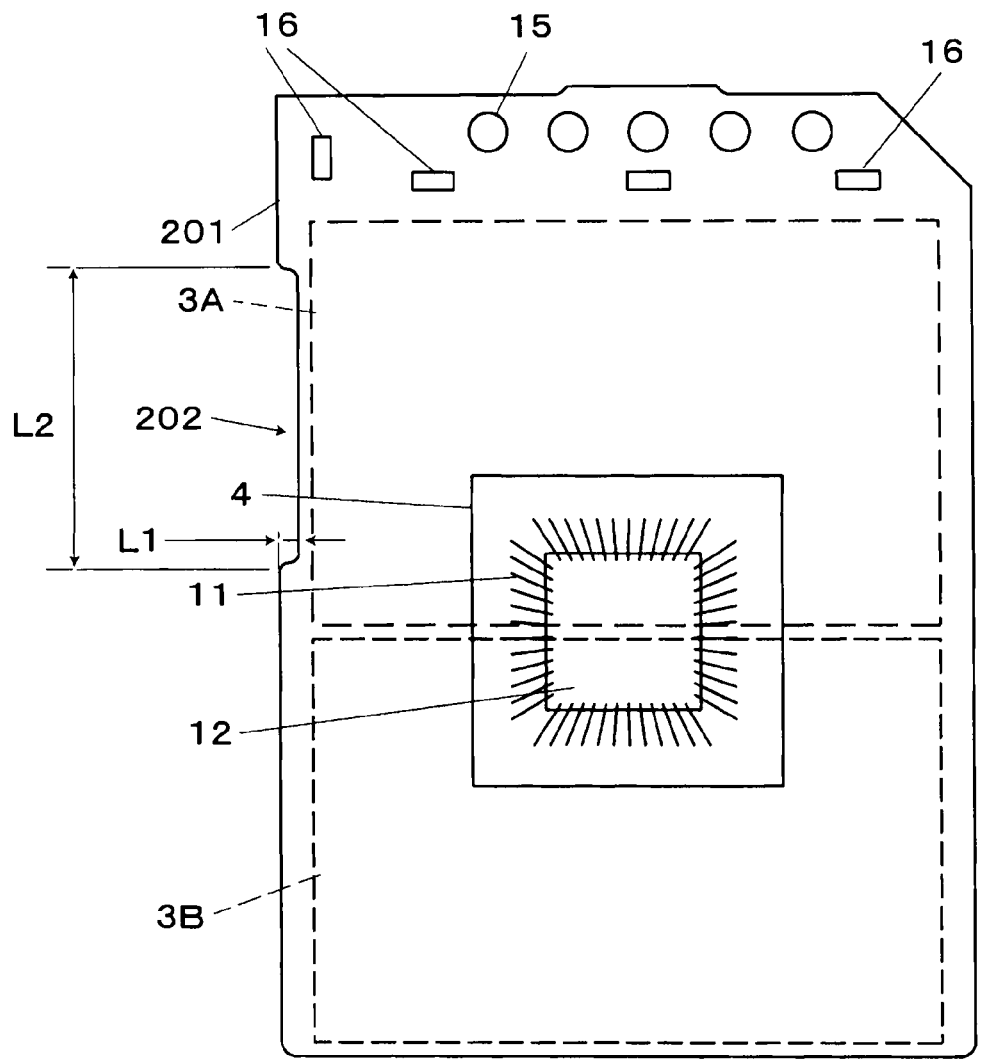
FIG. 10 is a planar view diagram which shows the structure of the substrate shown in FIG. 8 seen from the bottom surface, related to the first embodiment.

FIG. 10 is a planar view diagram which shows the construction of the substrate 201 shown in FIG. 8, seen from the bottom surface. In FIG. 10, the same symbols are used for the same structural elements as in FIG. 5. In FIG. 10, the controller chip 12 is mounted in a roughly central position of the bottom surface of the substrate 201 (middle position of the two memory packages 3A, 3B) according to the mounting position of the memory packages 3A and 3B. A plurality of chip condensers 16 are mounted in the upper part of the bottom surface of the substrate 201. Setting of the mounting position of this controller chip 12 is determined by the following reasons.

Figure 11:
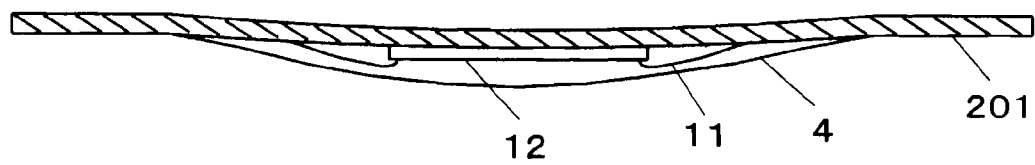
FIG. 11 is a diagram which shows an example where warping occurs on a substrate due to the resin potting of a controller chip related to the first embodiment.

After mounting the controller chip 12 on the substrate 201, when the controller chip 12 is sealed by the resin potting 4, an indentation sometimes occurs in the top surface of the substrate 201 as shown in FIG. 11. Particularly, in order to solder connect the memory package 3A, 3B and the chip condensers 16 by soldering, when the temperature is increased to a temperature greater than the melting point of the solder (for example, about 240 degrees Celsius), warping such as that shown in FIG. 11 easily occurs. When the substrate 201 warps in this way, there is a possibility that open defects might occur when solder connecting the memory packages 3A and 3B by solder on the top surface of the substrate 201. However, by mounting the controller chip 12 in a roughly central position on the bottom surface of the substrate 201 it is possible to limit the effects of indentation shaped warping to the ends of the memory packages 3A and 3B and reduce solder mounting defects.

Furthermore, in the SD memory card™ 200, because the mounting region of the memory packages 3A and 3B which are mounted on the top surface of the substrate 201, is expanded, the external dimensions of the write protect switch are reduced. The recess part formed on the substrate 201 corresponding to the mounting position of the write protect switch is also reduced. This structure will be explained while referring to FIG. 10, and FIG. 12 to FIG. 14.

In FIG. 10, a recess part 202 is formed on the left side of the substrate 201 corresponding to a mounting position of the write protect switch. The dimension L1 of this recess part 202 shown in FIG. 10 is smaller than the dimension L1 of the recess part 13 shown in FIG. 5. In addition, the dimension L2 of the recess part 202 shown in FIG. 10 is the same as the dimension L2 of the recess part 13 shown in FIG. 5. Furthermore, the dimension L1 of the recess part 202 is about 0.7 to 0.9 mm, the dimension of L1 of the recess part 13 is about 2 mm and dimension of L2 is about 15 mm. Because the dimension L1 of the recess part 202 is reduced, an example of the reduced dimensions of each part related to the write protect switch 17 shown in FIG. 6 and FIG. 7 is shown in FIG. 12 and FIG. 13.

Figure 12:
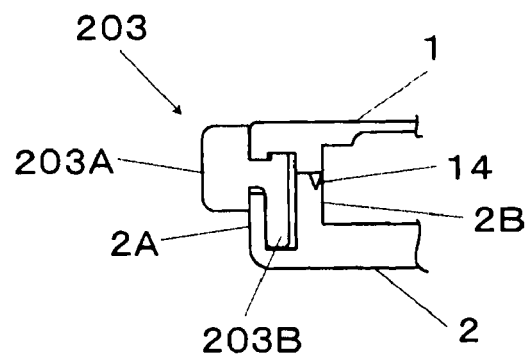
FIG. 12 is a cross sectional view diagram which shows the structure of the write protect switch part related to the first embodiment.

FIG. 12 us a cross sectional view diagram which shows the structure of the write protect switch 203 part. FIG. 13 is a planar view diagram which shows the structure of the write protect switch 203 part. In FIG. 12 and FIG. 13, the same symbols are used for the same structural elements shown in FIG. 6 and FIG. 7. In FIG. 12 and FIG. 13, the write protect switch 203 includes an operation part 203A and a switch main body 203B the same as the write protect switch 17 shown in FIG. 6 and FIG. 7. This write protect switch 203 uses the write protect switch main body 203 B shown in FIG. 13 with reduced dimensions. By using this write protect switch 203, it is possible to form the thickness L3 of an external wall rib 2A of the lower case 2 which houses the switch main body 203B, thinner than the thickness L3 of the external wall rib 2A of the lower case 2 shown in FIG. 7. Furthermore, the thickness of the external wall rib 2A of the bottom case 2 which houses the switch main body 203B is about 0.25 mm, and the thickness of the external wall rib 2A of the lower case 2 which houses the switch main body 17 is about 0.5 mm.

Figure 13:
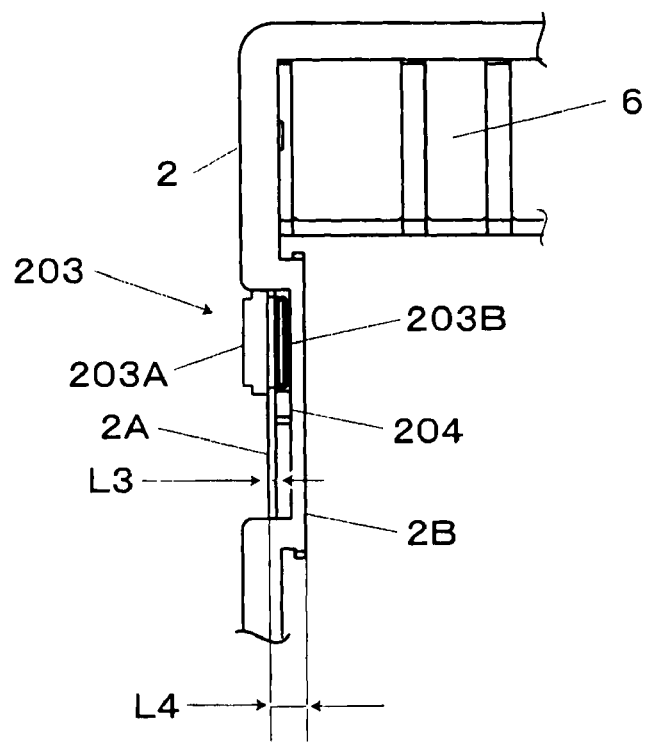
FIG. 13 is a planar view diagram which shows the structure of the write protect switch part related to the first embodiment.

In addition, by using the write protect switch 203 with reduced dimensions, the distance L4 from the external wall rib 2A of the bottom case 2 which houses the switch main body 203B shown in FIG. 13, to the internal wall rib 2B can similarly be further reduced when compared to the distance L4 shown in FIG. 5. Furthermore, the distance L4 from the external wall rib 2A which houses the write protect switch 203 to the internal wall rib 2B is about 1.1 mm, and the distance L4 from the external wall rib 2A which houses the write protect switch 17 to the internal wall rib 2B is about 2.4 mm. Furthermore, the write protect switch 203 is housed so that the operation part 203A is not exposed to the exterior of the bottom case 2 from the recess part 202 when the write protect switch 203 is housed in a mounting region formed in the recess part 202.

BY using the write protect switch 203 with reduced dimensions as above, it is possible to reduce the dimensions in a depth direction of the region in which the write protect switch 203 of the bottom case 2 is mounted. As a result, the dimension L1 in a depth direction of the recess part 202 in the substrate 201 can be reduced and the region in which the memory packages 3A and 3B are mounted on the top surface of the substrate 201 can be expanded.

In addition, in FIG. 13, a protrusion part for switch operation 204 is arranged on the bottom surface part between the external wall rib 2A of the bottom case which houses the write protect switch 203 and the internal wall rib 2B. The protrusion part for switch operation 204 is arranged so that the switch main body 203 is provided with resistance when sliding the operation part 203A of the write protect switch 203, similar to the protrusion part for switch operation 18 shown in FIG. 6. As a result, the write protect switch 203 does not slide unless the operation part 203A is applied with a certain amount of force (for example, about 1 to 4N). That is, the protrusion part for switch operation 204 is arranged so that setting and release of a write protect mode can be operated reliably.

Figure 14:
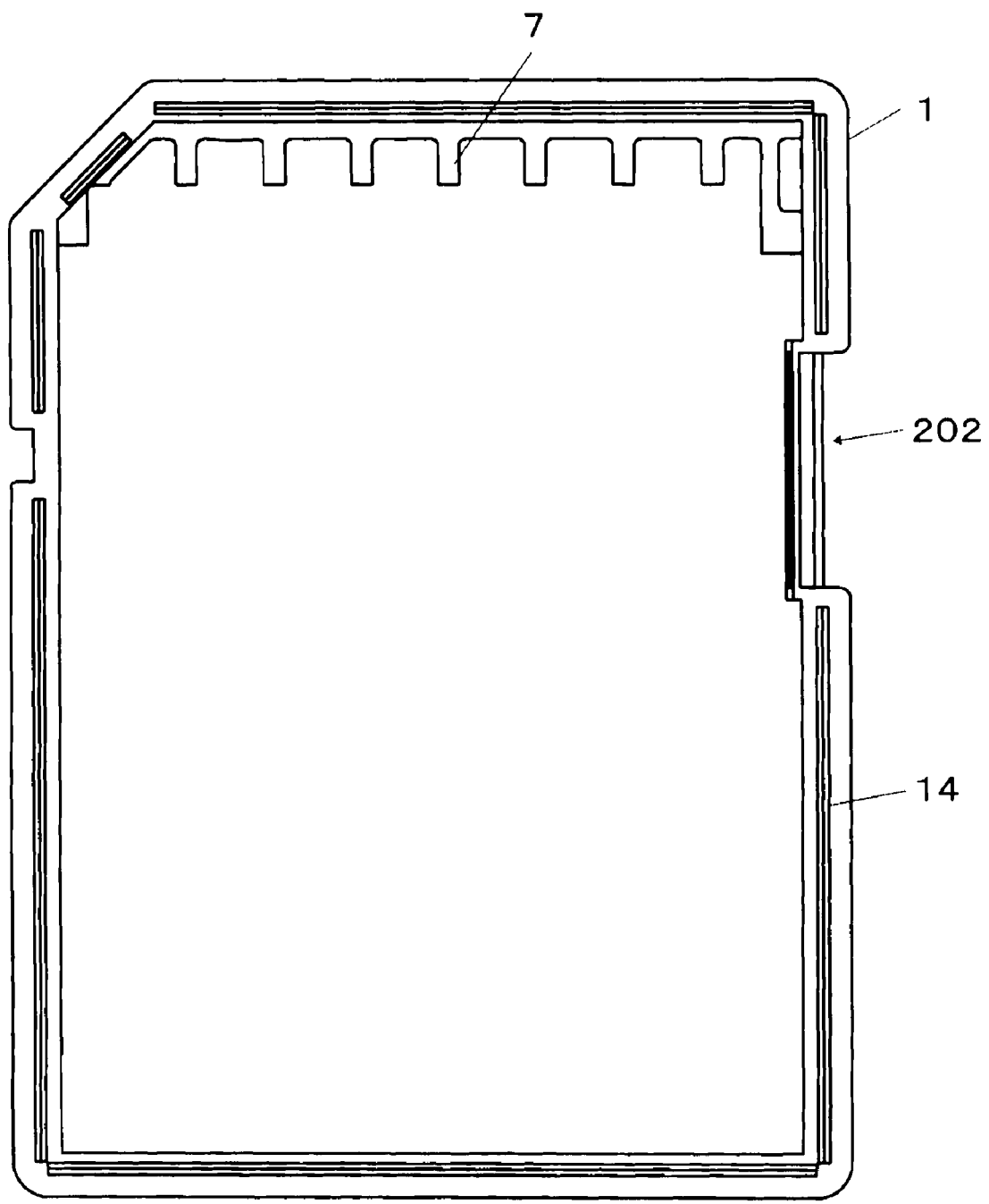
FIG. 14 is a planar view diagram which shows the structure of the interior of a bottom case attached to the top case shown in FIG. 12 and FIG. 13 related to the first embodiment.

FIG. 14 is a planar view diagram which shows the internal structure of the top case 1 (first case) welded and the bottom case 2 (second case) shown in FIG. 12 and FIG. 13. In FIG. 14, the same symbols are used for the same structural elements shown in FIG. 1 and FIG. 2. In FIG. 14, 202 is a recess part which houses the write protect switch 17, and 14 is protrusion part for welding (energy director) for welding the top case 1 and bottom case 2. The protrusion part for welding 14 is arranged the entire edge part within the top case 1. This protrusion part for welding 14 is formed with a reduced width the same size as the reduction in thickness of the inner wall rib 2B shown in FIG. 12.

As stated above, the SD memory card™ 200 related to the first embodiment has a structure in which two memory packages (semiconductor chips) 3A and 3B are mounted on the top surface (first surface) of the substrate 201 and a controller chip 12 is mounted on the bottom surface (second surface) of the substrate 201. In addition, the mounting position of the controller chip 12 is set in a roughly central position on the bottom surface of the substrate 201 (middle position of the two memory packages 3A and 3B), so that the effects of indentation shaped warping which occurs in the substrate 201 when the controller chip 12 is sealed by the resin potting 4, are reduced. Therefore, in the SD memory card™ 200, it is possible to increase memory capacity by at least twice compared to when the memory package 3 and the controller chip 12 were mounted only on the top surface of the substrate.

In addition, in the SD memory card™ 200 related to the first embodiment, each dimension L1 to L4 of the bottom case 2 and top case 1 related to this mounting region can be reduced using the write protect switch 203 with reduced dimensions. As a result, the region in which the memory packages 3A and 3B are mounted on the top surface of the substrate 201 can be further expanded.

Therefore, by applying the embodiments of the memory packages 3A and 3B and the controller chip 12 and a reduction of each part's dimensions and using the write protect switch 203 with reduced dimension, to the SD card™ 200, it is possible to significantly and easily increase memory capacity and maintain operability and package strength in the SD memory card™ which has a package with regulated dimensions.

Furthermore, in the first embodiment stated above, an explanation of the manufacturing process of the SD memory card™ was omitted, however, after explaining each SD memory card™ related to the second and third embodiment below, the manufacturing process of the SD memory card™ will be explained in detail.

Second Embodiment

In the second embodiment an example is explained of a structure of an SD memory card™ arranged with a strong reinforcement element on the surface of the substrate 201 which was mounted with the memory packages 3A and 3B shown in FIG. 8 in the first embodiment described above.

Figure 15:
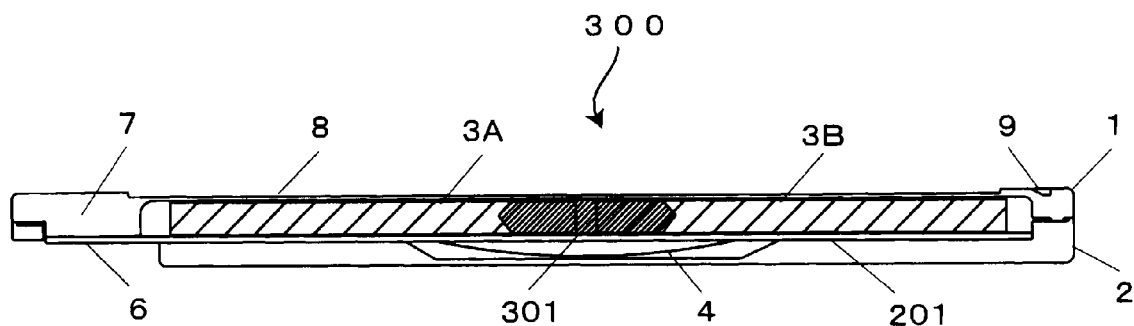
FIG. 15 is cross sectional view diagram which shows the structure of the SD card™ related to the second embodiment.
Figure 16:
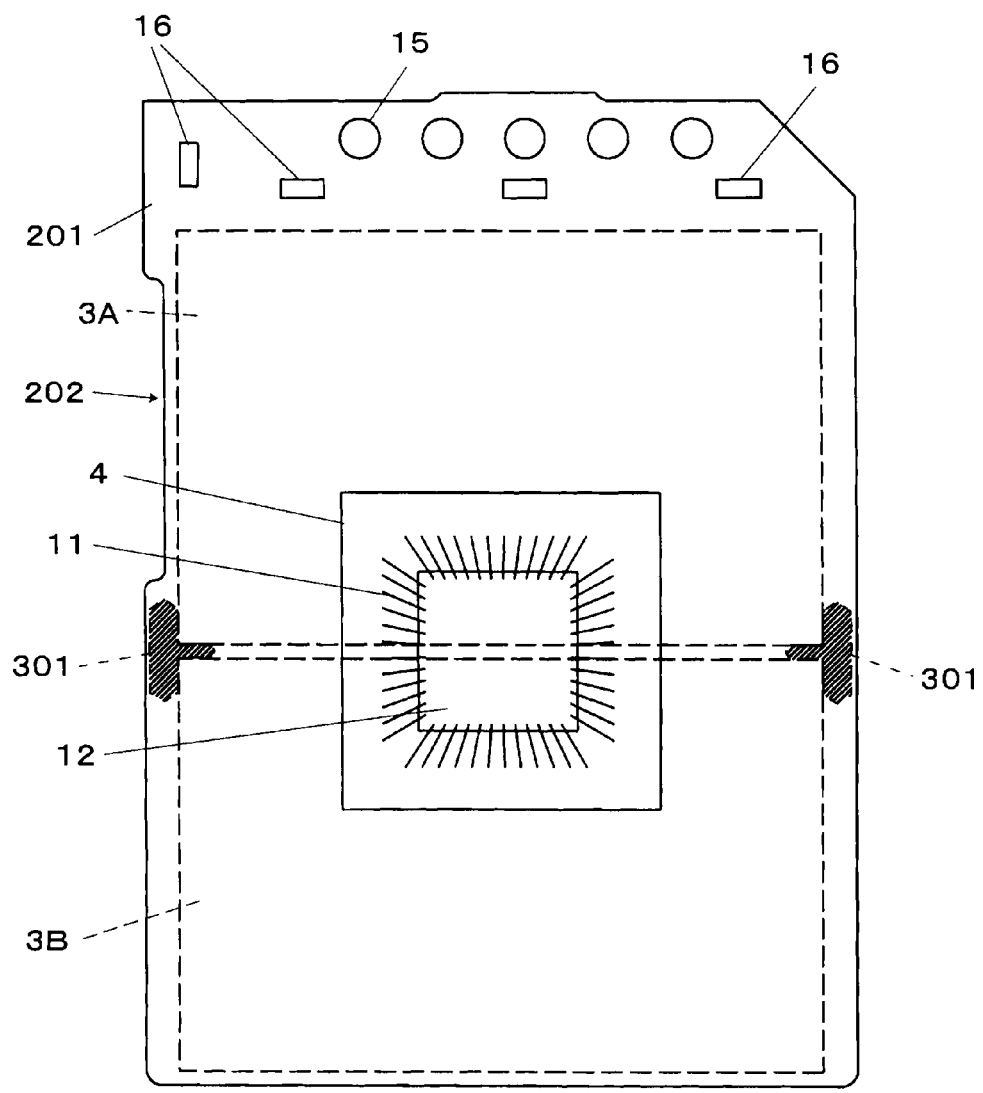
FIG. 16 is a planar view diagram which shows the structure of the substrate shown in FIG. 15 seen from the bottom surface, related to the second embodiment.

FIG. 15 is a cross sectional view diagram which shows the structure of an SD memory card™ 300 related to the second embodiment. FIG. 16 is a planar view diagram which shows the structure of the substrate 201 shown in FIG. 15 seen from the bottom surface. In FIG. 15 and FIG. 16, the same symbols are used for the same structural elements shown in FIG. 8 and FIG. 10.

In the SD memory card™ 300 shown in FIG. 15 and FIG. 16, the structural elements which are different to those of the SD memory card™ 200 shown in the first embodiment are that a resin 301 is coated to the top surface of the substrate 201 which is mounted with the memory packages 3A and 3B. This resin 301 is coated only to both side parts of the substrate 201 in a position between the two memory packages 3A and 3B.

By coating the resin 301 in this way, it is possible to relax the transformation of the substrate 201 which bends when a bending force is applied to the SD memory card™ 300, and prevent cracks etc appearing in the controller chip 12. That is, because the resin 301 is coated to a position in which bending force is concentrated, it is possible to reinforce the strength of the substrate 201.

Third Embodiment

In the third embodiment, an example is explained of a structure of an SD memory card™ in which the mounting position of the controller chip 12 on the substrate 201 shown in FIG. 8 and FIG. 10 in the first embodiment described above is changed.

Figure 17:
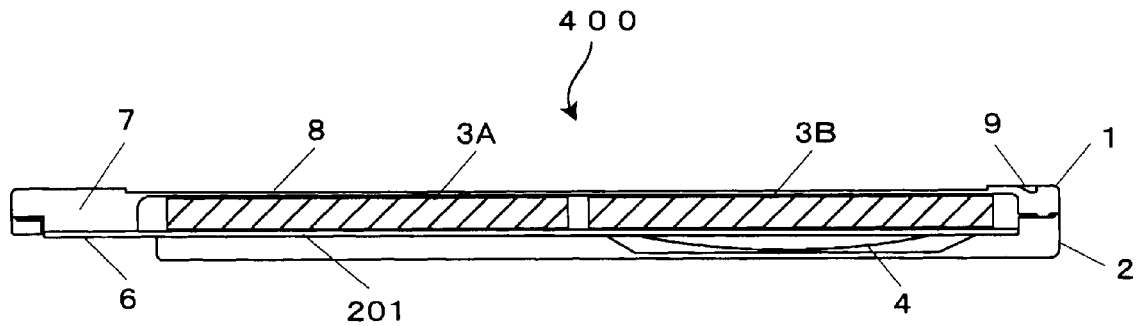
FIG. 17 us a cross sectional view diagram which shows the structure of the structure of the SD card™ related to the third embodiment.
Figure 18:
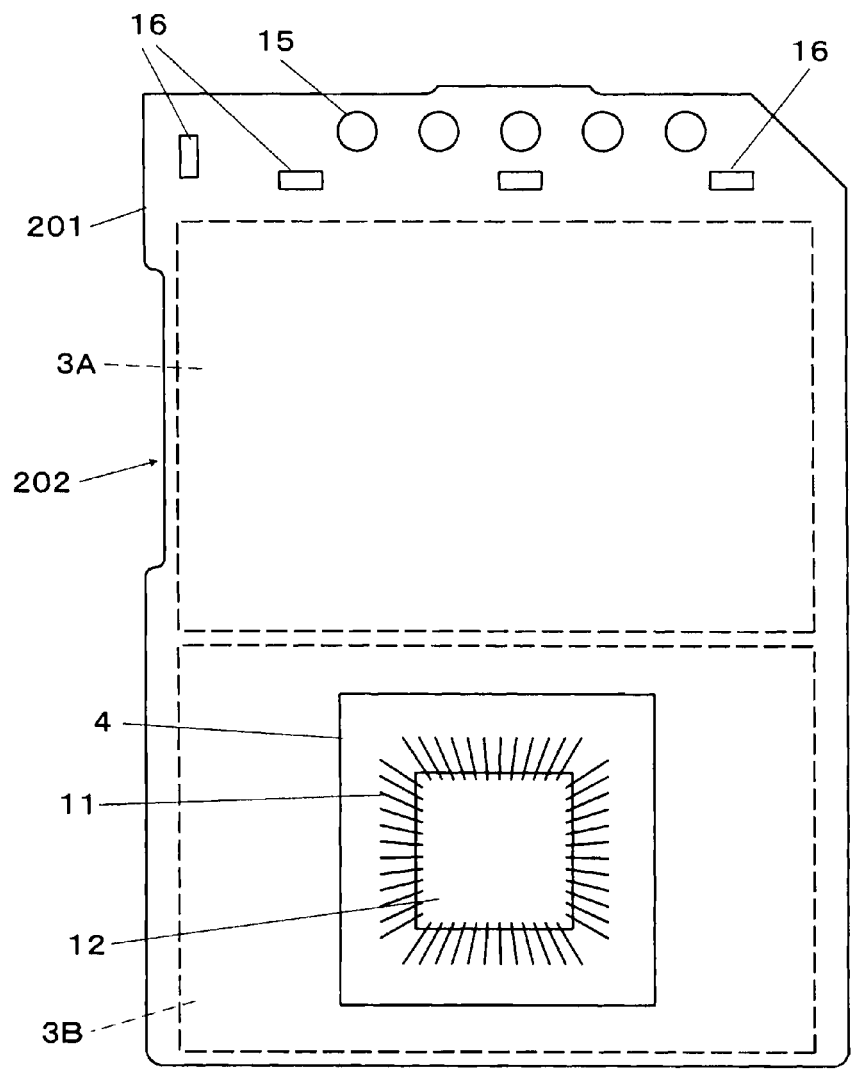
FIG. 18 is a planar view diagram which shows the structure of the substrate shown in FIG. 17 seen from the bottom surface, related to the third embodiment.

FIG. 17 is a cross sectional view diagram which shows the structure of an SD memory card™ 400 related to the third embodiment. FIG. 18 is a planar view diagram which shows the structure of the substrate 201 shown in FIG. 17 seen from the bottom surface. In FIG. 17 and FIG. 18, the same symbols are used for the same structural elements shown in FIG. 8 and FIG. 10.

In the SD memory card™ 400 shown in FIG. 17 and FIG. 18, the structural elements which are different to those of the SD memory card™ 200 shown in the first embodiment are that the mounting position of the controller chip 12 which is mounted on the bottom surface of the substrate 201 has been changed to directly below the memory package 3B.

By changing the mounting position of the controller chip 12 in this way, it is possible prevent cracks etc appearing in the controller chip 12 when a bending force is applied even if the resin 301 shown in the second embodiment is not coated.

Figure 19:
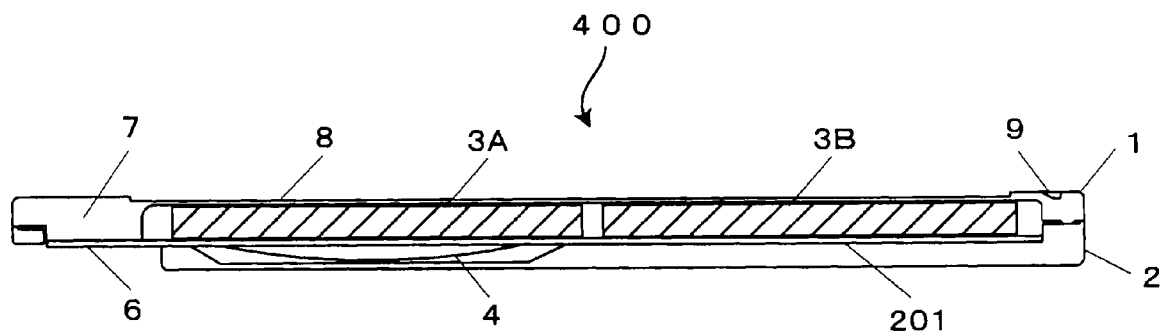
FIG. 19 is cross sectional view diagram which shows another structure of the SD card™ related to the third embodiment.
Figure 20:
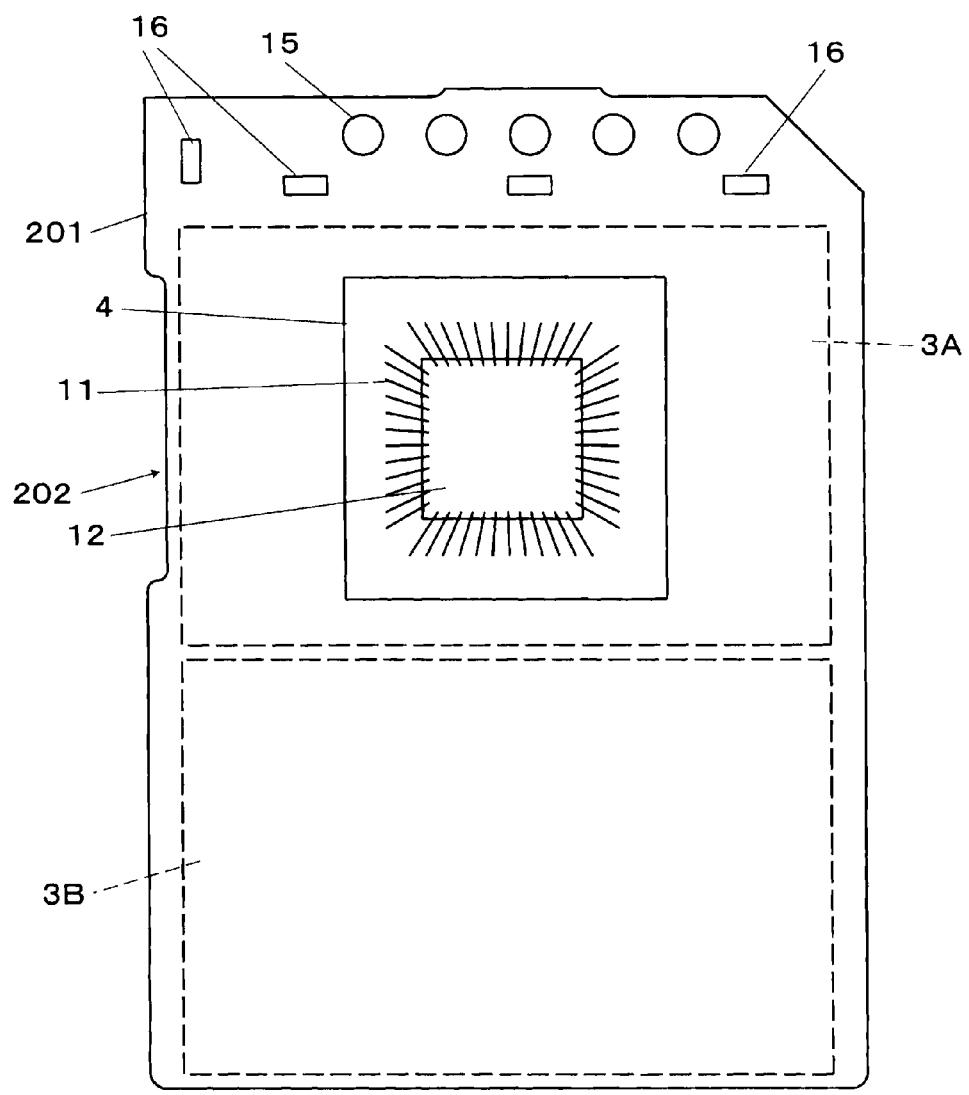
FIG. 20 is a planar view diagram which shows the structure of the substrate shown in FIG. 19 seen from the bottom surface, related to the third embodiment.

In addition, in the SD memory card™ 400 shown in FIG. 19 and FIG. 20, the mounting position of the controller chip 12 which is mounted on the bottom surface of the substrate 201, may be changed to directly below the memory package 3A. In this case, the length of a wire (not shown in the diagram) which connects the controller chip 12 and the terminal parts 6 can be shortened when compared to the mounting position of the controller chip 12 shown in FIG. 17 and FIG. 18. In addition, by shorten the wire length between the controller chip 12 and the terminal parts 6, it becomes possible to increase the speed of transmission of a signal which is input to the controller chip 12 from the terminal parts 6. As a result, this also contributes to improving the operation speed of the SD memory card™ 400.

Other Embodiments

In the other embodiments, a structural example of the substrate 201 and the manufacturing process of the SD memory card™ is explained as an alternative technology which is applied to the SD memory cards™ 200, 300 and 400 shown in the first, second and third embodiments.

Figure 21:
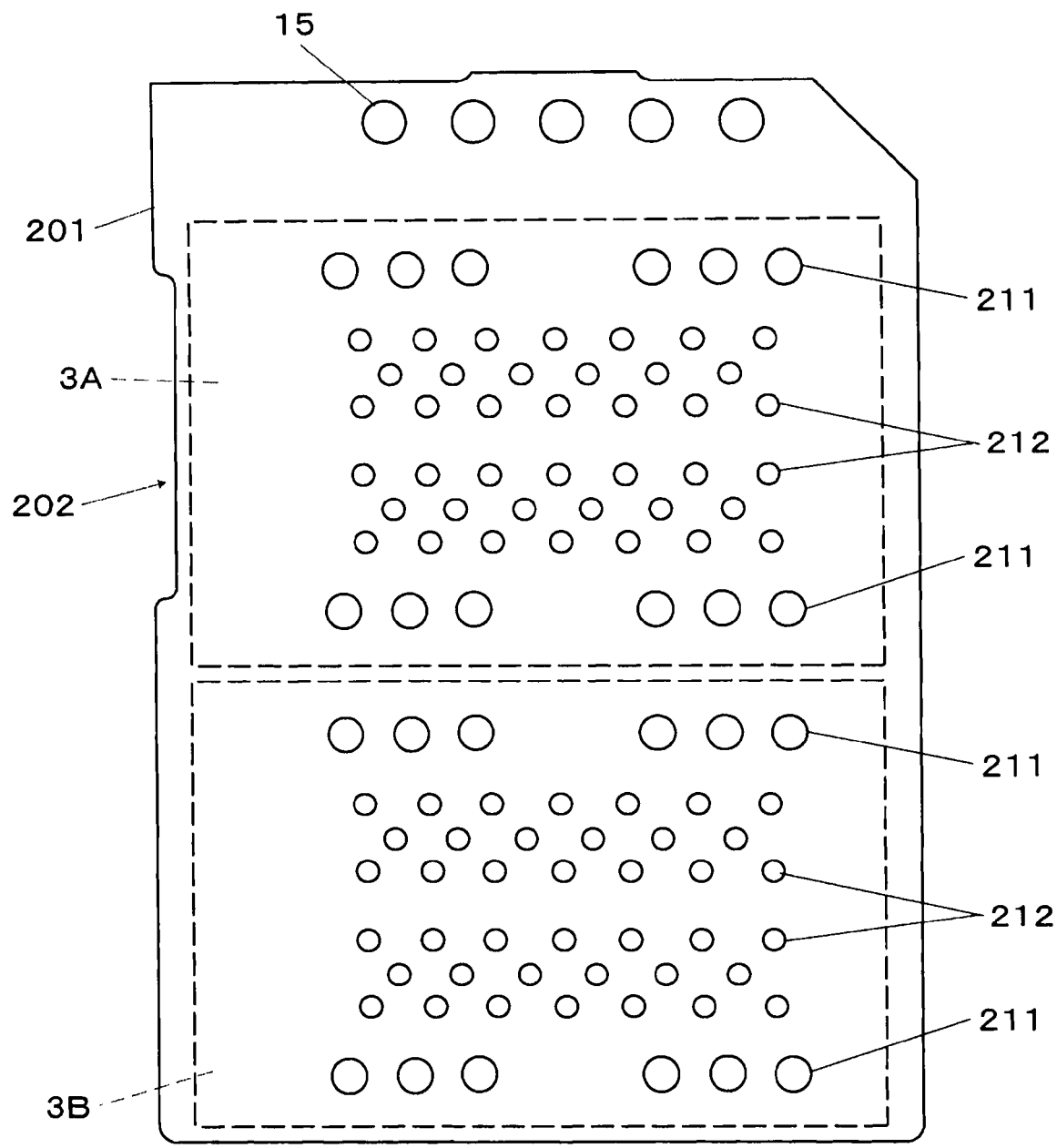
FIG. 21 is a diagram which shows an example structure of a solder resist pattern of the mounting surface of a memory package of the substrate related to another embodiment.

FIG. 21 is a diagram which shows an example structure of solder regist opening pattern of the memory package mounting surface on the substrate 201. In FIG. 21 the same symbols are used for the same structural elements shown in FIG. 10. In FIG. 21, a solder regist opening pattern 211 and 212 are formed to match each position of the solder connection terminals of the memory packages 3A and 3B on the mounting surface of the memory packages 3A and 3B on the substrate 201.

Figure 22:
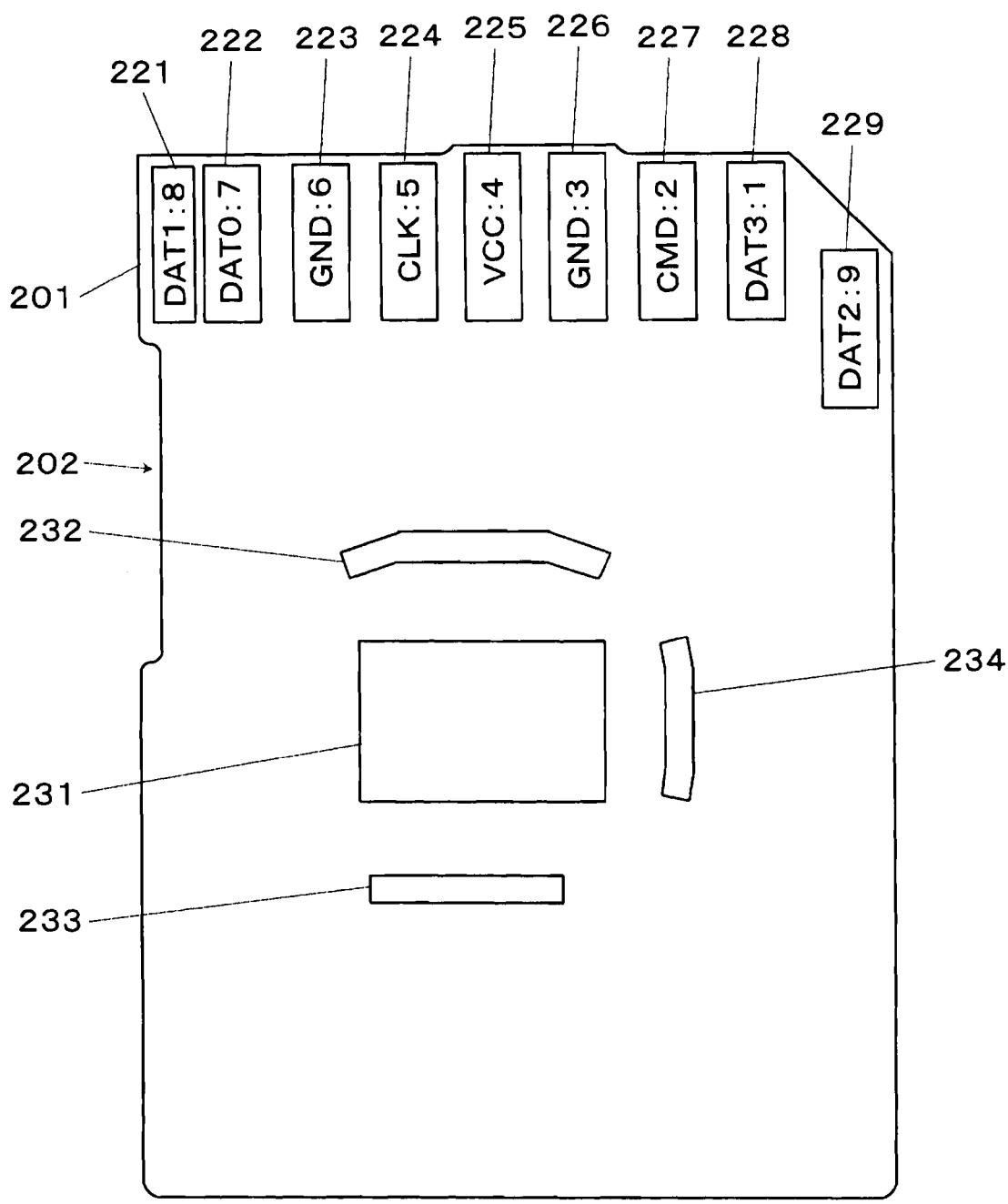
FIG. 22 is a diagram which shows an example structure of a solder resist pattern of the mounting surface of a memory package of the controller chip related to another embodiment.

FIG. 22 is a diagram which shows an example structure of solder regist pattern of the controller chip mounting surface on the substrate 201. In FIG. 22 the same symbols are used for the same structural elements shown in FIG. 10. In FIG. 22, a pattern 231 which shows the mounting position of the controller chip 12 and solder regist opening patterns 232 to 234 are formed to match each pad position of the bonding pad of the controller chip 12 on the mounting surface of the controller chip 12 on the substrate 201.

In addition, in FIG. 22, gold terminal patterns 221 to 229 are formed corresponding to the pin positions of the terminals parts 6 shown in FIG. 2, on the mounting surface of the controller chip 12 of the substrate 201. The gold terminal pattern 221 corresponds to DAT1 pin ($8^{th}$ pin), the gold terminal pattern 222 corresponds to pin DAT0 ($7^{th}$ pin), the gold terminal pattern 223 corresponds to pin GND ($6^{th}$ pin), the gold terminal pattern 224 corresponds to pin CLK ($5^{th}$ pin), the gold terminal pattern 225 corresponds to pin Vcc ($4^{th}$ pin), the gold terminal pattern 226 corresponds to pin GND ($3^{th}$ pin), the gold terminal pattern 227 corresponds to pin CMD ($2^{nd}$ pin), the gold terminal pattern 228 corresponds to pin DAT3 ($1^{st}$ pin), and the gold terminal pattern 229 corresponds to pin DAT2 ($0^{th}$ pin).

Figure 23:
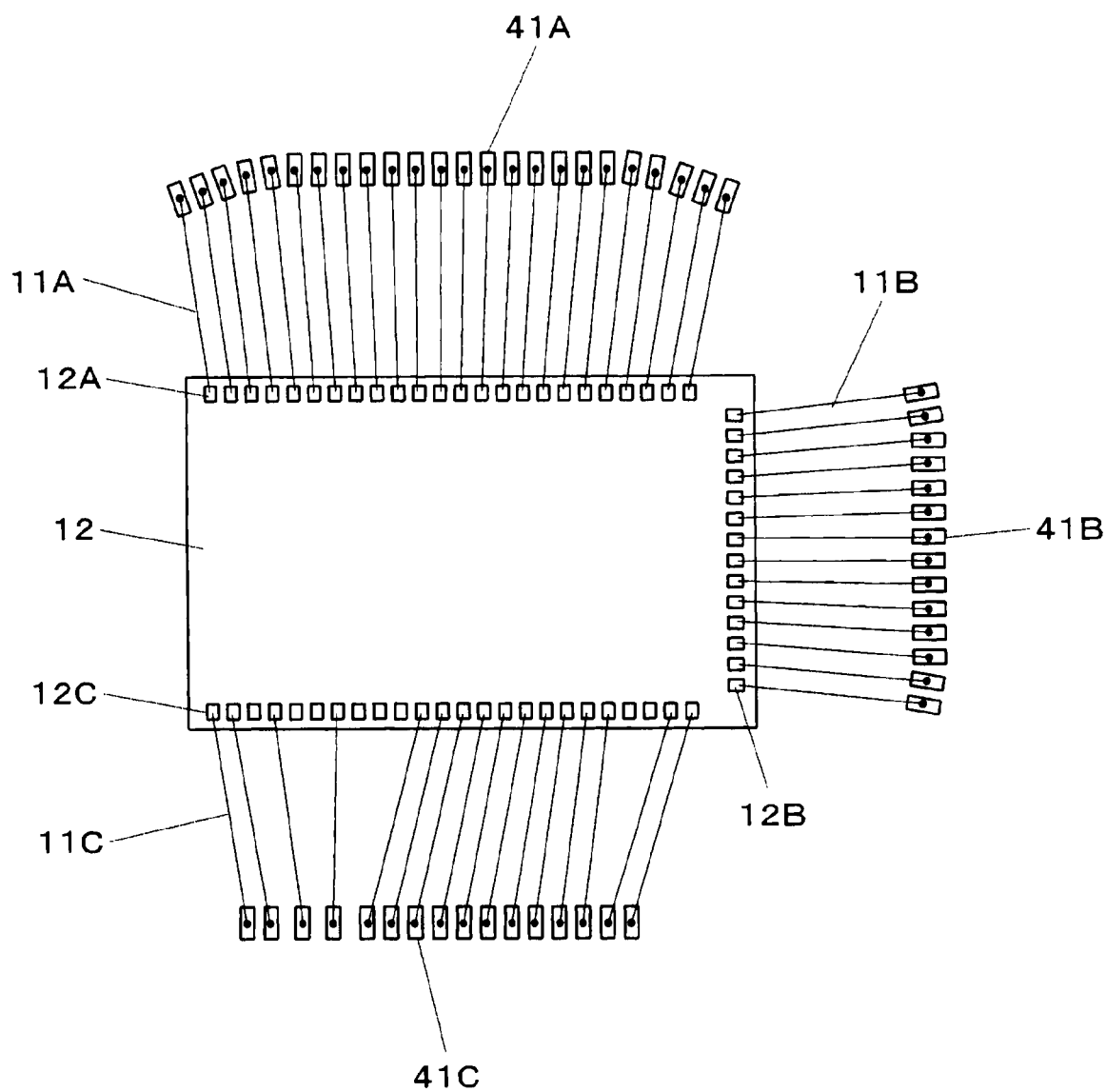
FIG. 23 is a diagram which shows an example structure of a bonding pad of the controller chip related to another embodiment.

FIG. 23 is a diagram which shows an example structure of a bonding pad of the controller chip 12. In FIG. 23, terminal groups 12A to 12C which connect the bonding wires are shown formed on the upper, lower and right sides of the diagram. Bonding pad groups 41A to 41C are formed to match the formation position of these terminal groups 12A to 12C. Each terminal group 12A to 12C and each bonding pad group 41A to 41C are connected by bonding wire groups 11A to 11C. In this case, the bonding pad groups 41A and 41B are arranged in an arch shape so that the distance of the bonding wire groups 11A and 11B are nearly the same. For example, the difference between the length of the wires of the bonding wire groups 11A and 11B is about 30%.

Figure 24:
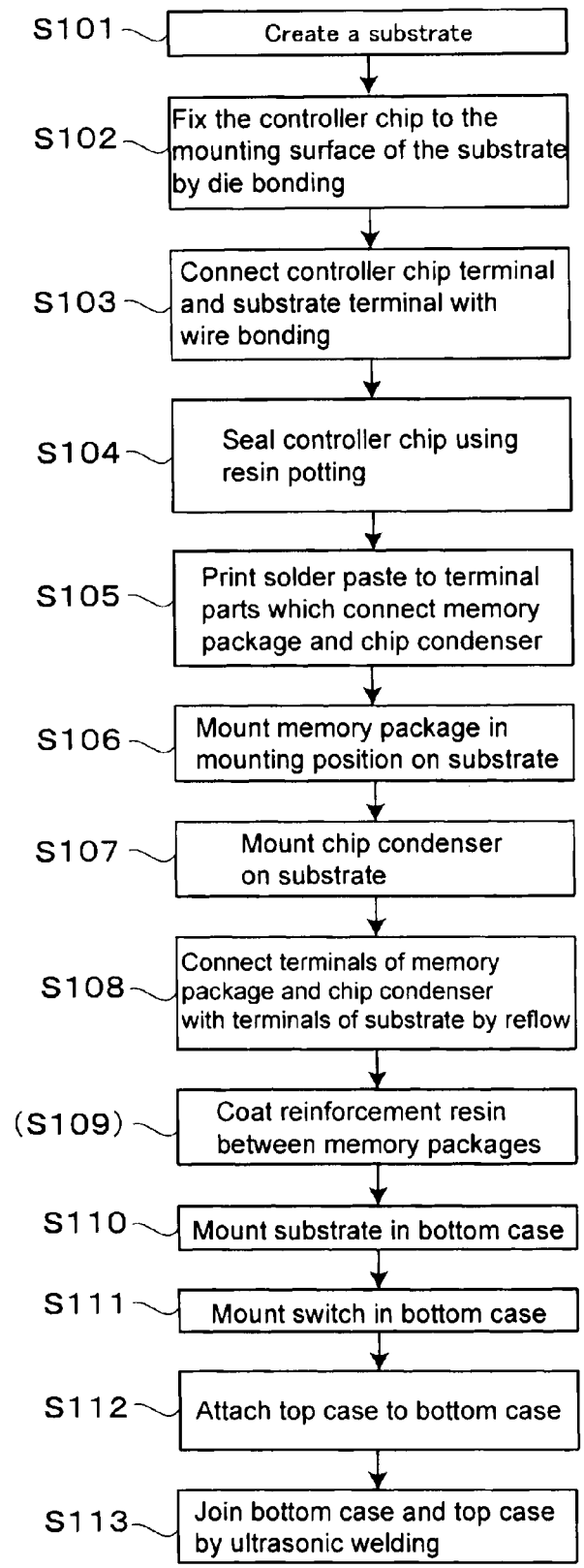
FIG. 24 is a diagram which shows the manufacturing process of the SD memory card™ related to another embodiment.

FIG. 24 is a diagram which shows an example of the manufacturing process of the SD memory cards™ 200, 300 and 400 shown in the first, second and third embodiments described above.

In FIG. 24, first, the substrate is created (step S101). In this case, a test pad 15, solder regist opening patterns 211, 212, a pattern 231, gold terminal patterns 221 to 229 and solder regist opening patterns 232 to 234 are formed on the top and bottom surfaces of the substrate 201.

Next, the controller chip 12 is fixed to the bottom surface of the substrate 201 by die bonding (step S102). Next, each terminal group 12A to 12C and each bonding pad group 41A to 41C of the controller chip 12 are connected together by the wire bonding groups 11A to 11C by a wire bonding (step S103). Next, the controller chip 12 is sealed by a resin potting 4 (step S104).

Next, a solder paste is printed to the terminal parts which connect the memory packages 3A, 3B and the chip condensers 16 on the substrate 201 (step S105). Next, the memory packages 3A and 3B are mounted on the top surface of the substrate 201 (step S106). Next, chip condensers 16 are mounted in the mounting position of the condenser on the top surface of the substrate 201 (step S10). Next, each terminal of the memory packages 3A, 3B and chip condensers 16 and the solder regist patterns 232 to 234 on the top surface of the substrate 201 are connected using solder by reflow (step S108).

Next, the resin 301 is coated to both side parts between the two memory packages 3A and 3B which are mounted on the top surface of the substrate 201 (step S109). Furthermore, because this process is a process corresponding to the SD memory card™ 300 shown in the second embodiment described above, this process can be omitted. Furthermore, in FIG. 24, the step S109 shown in the brackets, shows a process which can be omitted. The mounting process of the chip on the substrate or the elements on the chip is completed by the processes in the steps S101 to S109.

Next, the substrate 201 is mounted in a substrate mounting position within the bottom case 2 (step S110). Next, the write protect switch 203 is mounted in a switch mounting position in the bottom case 2 (step S111). Next, the top case 1 is attached to the bottom case 2 (step S112). Next, the bottom case 2 and the top case 1 are joined by ultrasonic welding (step S113). In this case, when an ultrasonic welding process is performed, the bottom case 2 and the top case 1 are welded and joined by the welding protrusion part (energy director) which is arranged around the entire inner side of the top case 1. The memory cards 200, 300 and 400 shown in the first, second and third embodiments are completed by the manufacturing process described above.

Furthermore, the first, second and third embodiments described above showed the case where an SD memory card™ was used, however, the embodiments are not limited to an SD memory card™. The present invention can also be applied to other semiconductor memory cards as long as an external case includes the regulated dimensions, such as a mini SD card™.

What is claimed is:
1. A semiconductor memory card comprising:
a plurality of semiconductor memory packages;
a controller chip which controls said plurality of semiconductor memory packages; and
a substrate, said plurality of semiconductor memory packages being mounted on a top surface of said substrate and said controller chip being mounted on a bottom surface of said substrate;
wherein a position of said controller chip on said bottom surface matches a mounting position of one of said plurality of semiconductor memory packages on said top surface.

2. The semiconductor memory card according to claim 1, wherein a plurality of passive elements except said plurality of semiconductor memory packages and said controller chip are mounted on said bottom surface outside of a mounting region of said controller chip.

3. The semiconductor memory card according to claim 1, wherein said substrate is the area outside of said mounting region of said plurality of memory packages and is arranged with a reinforcement material on said top surface.

4. The semiconductor memory card according to claim 3, wherein said reinforcement material is a resin coated on said top surface.

5. The semiconductor memory card according to claim 1, wherein a connection pattern is formed electrically connected to match each formation position of a plurality of connection terminals which are formed on said plurality of semiconductor memory packages in said mounting region of said top surface of said substrate, and a connection pattern is formed electrically connected to match each formation position of a plurality of connection terminals which are formed on said controller chip in said mounting region of said bottom surface of said substrate.

6. The semiconductor memory card according to claim 5, wherein said connection pattern which is connected with said plurality of connection terminals of said controller chip is arranged at an almost equal distance from said plurality of connection terminals.

7. A semiconductor memory card comprising:
a plurality of semiconductor memory packages;
a controller chip which controls said plurality of semiconductor memory packages;
a substrate, said plurality of semiconductor memory packages being mounted on a top surface of said substrate and said controller chip being mounted on a bottom surface of said substrate;
a switch which includes an operation part which switches an operation state of said plurality of semiconductor memory packages; and
a case member in which a housing part which houses said substrate and an opening part which exposes said operation part are formed;
wherein
said substrate includes a recess part formed outside said mounting region of said plurality of semiconductor memory packages according to the size and formation position of said opening part, and said recess part is a size which does not interfere with said mounting region of said plurality of semiconductor memory packages which are mountable on said top surface, and
a position of said controller chip on said bottom surface matches a mounting position of one of said plurality of semiconductor memory packages on said top surface.

8. The semiconductor memory card according to claim 7, wherein said operation part includes an operation range according to a longitudinal size of said opening part, and said operation part and the main body of said switch is a size which does not protrude to the exterior from said opening part and to the inner part of said substrate from said recess part.

9. The semiconductor memory card according to claim 8, wherein said operation part and said main body of said switch are a size which does not interfere with said mounting region of said plurality of semiconductor memory packages of said substrate.

10. The semiconductor memory card according to claim 7, wherein said case member is comprised of a first case member and a second case member, said second case member being arranged with an inner wall rib which separates said recess part from a part which houses said substrate corresponding to said opening part, and an outer wall rib which movably supports in a longitudinal direction of said opening part said operation part and said main body of said switch within said recess part, and an interval between said outer wall rib and said inner wall rib is set so that said operation part does not protrude externally from said recess part and said main body of said switch becomes housable.

11. The semiconductor memory card according to claim 10, wherein said inner wall rib is arranged in a position which does not interfere with said mounting region of said plurality of semiconductor memory packages of said substrate.

12. The semiconductor memory card according to claim 10, wherein said outer wall rib formed thinner than said inner wall rib.

13. The semiconductor memory card according to claim 10, wherein said operation part moves in a longitudinal direction of said opening part and said main body of said switch moves according to the movement of said operation part, and said second case member is arranged with a switch operation protrusion part on the bottom surface part between said inner wall rib and said outer wall rib, said switch operation protrusion part providing resistance to said main body of said switch when said operation part moves.

14. The semiconductor memory card according to claim 7, wherein the external dimensions of said case members are formed corresponding to the regulated external dimensions of a memory card.

15. A semiconductor memory card comprising:
a plurality of semiconductor memory packages;
a controller chip which controls said plurality of semiconductor memory packages; and
a substrate, said plurality of semiconductor memory packages being mounted on a top surface of said substrate and said controller chip being mounted on a bottom surface of said substrate;
wherein
said substrate is mounted with said controller chip in a position on said bottom surface which matches a mounting position of one semiconductor memory package among said plurality of semiconductor memory packages on said top surface.

\* \* \* \* \*